United States Patent [19]

Rydel

[11] Patent Number: 5,530,405
[45] Date of Patent: Jun. 25, 1996

[54] LOW CONSUMPTION MULTI-STAGE AMPLIFIER, AND A VEHICLE ONBOARD SIGNAL RECEIVER HAVING SUCH AN AMPLIFIER

[75] Inventor: Charles Rydel, Paris, France

[73] Assignee: Valeo Electronique, Creteil Cedex, France

[21] Appl. No.: 410,122

[22] Filed: Mar. 23, 1995

[30] Foreign Application Priority Data

Mar. 24, 1994 [FR] France .................................. 94 03457

[51] Int. Cl.$^6$ .................................................... H03G 3/30
[52] U.S. Cl. ...................... 330/278; 330/311; 455/234.1
[58] Field of Search ................... 330/278, 282, 330/283, 302, 306, 310, 311; 455/234.1, 241.1, 251.1

[56] References Cited

U.S. PATENT DOCUMENTS 2,926,307  2/1960  Ehret ........................................ 330/289

5,304,946  4/1994  Sano et al. ........................... 330/311 X

FOREIGN PATENT DOCUMENTS 0060164  9/1982  European Pat. Off. .
0549045  6/1993  European Pat. Off. .

*Primary Examiner*—Steven Mottola
*Attorney, Agent, or Firm*—Morgan & Finnegan

[57] ABSTRACT

A multi-stage amplifier of low current consumption, such as an onboard receiver for a motor vehicle for receiving telecontrol systems for opening the doors or interrogation signals for the alarm system of the vehicle, has the polarising networks for the amplification stages connected in series in such a way as to reduce the power consumption of the circuitry in the static state. The amplifier stages are connected in series on the polarising bridge in the static state, and in the dynamic state they are connected in cascade. The output of the first stage is connected to the input of the next stage through an impedance matching reactance. In another aspect, gain is controlled by injection/extraction of current between the output terminal of the amplifier and an injection/extraction terminal on the input of the first stage.

9 Claims, 2 Drawing Sheets

LOW CONSUMPTION MULTI-STAGE AMPLIFIER, AND A VEHICLE ONBOARD SIGNAL RECEIVER HAVING SUCH AN AMPLIFIER

FIELD OF THE INVENTION

The present invention relates to a multi-stage amplifier having a low current consumption, and to a receiver having such an amplifier. Such a receiver may consist more particularly of a receiver which is mounted on board a motor vehicle. Receivers of this kind are arranged in particular for receiving telecontrol signals, such as those used for opening the doors of the vehicle. The receiver may equally well be a receiver for receiving interrogation waves or signals, for the purposes of, for example, a volumetric ultrasonic alarm system in a vehicle.

BACKGROUND OF THE INVENTION

In modern vehicles there is an increasing tendency to provide functions which require an electrical load to remain supplied with power and functional at all times, or at least at all times when in a state of surveillance, even when the user of the vehicle has closed and immobilised the vehicle. This is especially so as regards systems for giving access to the vehicle, which enable the latter to be opened through a telecontrol system in which a radio frequency signal embodying an authorised code is transmitted to a receiver on board the vehicle. It is also the case as regards alarm systems using interrogation signals, which lead to an alarm being given if a predetermined event is detected, such as unauthorised intrusion or breaking of the glass of the cabin of the vehicle.

These systems are permanently connected to the vehicle battery, and sometimes to emergency power supplies, in particular with a view to giving protection against malicious damage or the occurrence of faults. Because of this it is desirable to arrange that these systems shall consume as little current as possible.

In addition, such systems must comprise electronic circuitry of very high performance, because the signals received by the system are generally of very low amplitude.

In French patent application No. 93 03191, filed on Mar. 19, 1993, the present Applicant has already proposed a circuit which is constructed around an intermediate frequency amplifier having at least two amplifying stages connected in series to the electrical power supply, with its input terminals being connected in cascade. Such an arrangement is perfectly satisfactory in the performance range envisaged, particularly in regard to electrical power consumption. However, in this circuitry, dynamic coupling of the two stages is obtained through a pair of transformers. These transformers must be matched to the working frequency. In addition they tend to be unduly sensitive to temperature, and they occupy a significant amount of space. Besides all this, the transformers are sensitive to electromagnetic fields in the environment, and in modern vehicles these fields are tending to become stronger.

DISCUSSION OF THE INVENTION

An objective of the invention is to overcome the above mentioned drawbacks of the present state of the art.

According to the invention, an amplifier for use in an onboard receiver, more particularly in a motor vehicle, comprises at least one first amplifier stage and a second amplifier stage, comprising transistors in which the biasing networks for the stages are connected in series in such a way as to reduce the power consumption of the circuitry in the static state, in that the input networks of the said stages are coupled through reactances such as capacitors.

This arrangement according to the present invention overcomes the disadvantages mentioned above, while preserving the advantages of the invention the subject of the above mentioned French patent application, and it removes the need to provide transformers.

According to a preferred feature of the invention, the stages of the amplifier are separated one from another in the dynamic state, firstly by means of a first capacitor connected between their point of connection on the collector side and ground, and secondly through a second capacitor which is connected between their point of connection on the base side and ground.

According to another preferred feature of the invention, the connecting reactances are so dimensioned as to work in the bandwith of the amplifier as impedance converters, so as to match the output resistance of the preceding stage to the input impedance of the next following stage.

According to yet another preferred feature of the invention, the output branch of at least one of the stages of the amplifier comprises a circuit for reinforcing the gain at high frequencies. Preferably, with this arrangement, the circuit for reinforcing the gain at high frequencies is a circuit tuned to the working frequency of the amplifier.

Preferably, the amplifier includes at least one stage connected for impedance matching and disposed between two successive stages, with which it is connected in series.

According to another preferred feature of the invention, the amplifier includes a gain control means comprising a current take-off transistor which is connected between the output terminal of the amplifier and a terminal for injection or extraction of current, which is disposed on the emitter of the transistor of the first stage, the base of the current take-off transistor being connected to the output of a gain control circuit.

Preferably, the gain control circuit includes a transistor, the base of which is connected to the output of the amplifier, with its conduction path being connected to the input of a detector circuit the output of which is connected to the base of the current take-off transistor.

According to the invention in a second aspect, a receiver for an interrogation signal system, such as an ultrasonic alarm system fitted on board a vehicle, is characterised in that it comprises an amplifier in accordance with the invention in its first aspect. With the input of the said amplifier being connected through a low pass filter to a detector for detecting the interrogation signal, the gain control means of the said amplifier includes an output gate of a microcontroller which produces a series of recurring square signals having a cyclic ratio which is an adjustment value for the gain of the amplifier.

According to the invention in a third aspect, a receiver for a keyless system for giving access to a vehicle is characterised in that it comprises an amplifier according to the invention in its first aspect. The input of the amplifier being connected to the output of a mixer, which has a first input connected to a receiving antenna and a second input connected to a local oscillator, and in that the gain control means has a diode detector.

Further features and advantages of the invention will appear more clearly on a reading of the description of

DESCRIPTION OF PREFERRED EMBODIMENTS OF THE INVENTION

Figure 1:
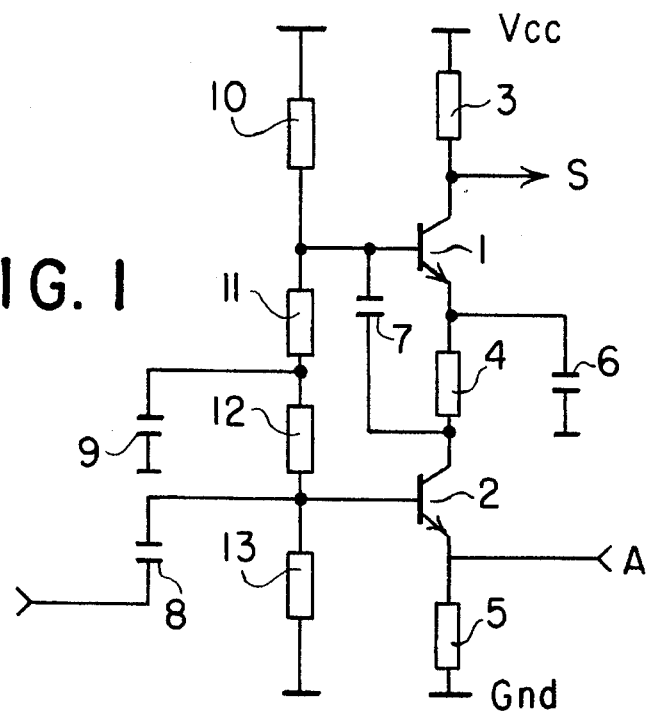
FIG. 1 is a circuit diagram of one embodiment of an amplifier in accordance with the invention.

FIG. 1 shows an amplifier having two amplifying stages 1 and 2 which are connected in the particular way that is characteristic of the invention. In this connection, in the static state of the system, the amplifying stages are fed through a resistive branch or biasing bridge or network comprising a set of resistors 10 to 13, which are connected in series between the positive supply voltage Vcc (see the upper horizontal fine line), and electrical ground or earth Gnd of the amplifier (see the lower horizontal heavy line).

The first stage comprises an amplifying transistor 2, the base of which is connected to the common point of the two resistors 12, 13 of the biasing bridge 10 to 14, and to an input terminal E through a coupling capacitor 8.

The second stage comprises an amplifying transistor 1, the base of which is connected to the common point of the two resistors 10 and 11 of the biasing bridge 10 to 14, and to the output of the first stage 2, taken on the collector of the transistor 2 via a reactance which preferably consists of a coupling capacitor 7. In general terms, the reactance 7 serves as a converter, or impedance adaptor, between the output impedance of the first transistor 2 and the input impedance of the second transistor 1.

The operating point of the transistor stages 1 and 2 is adjusted, respectively, by: a resistor 3 which is connected between the connection to the positive power supply terminal Vcc and the collector of the transistor 1; by a resistor 4 connected between the emitter of the transistor 1 and the collector of the transistor 2; and finally by a resistor 5, which is connected between the emitter of the transistor 2 and ground Gnd.

In order to separate the two stages 1 and 2 in the dynamic mode, the connection point between the resistors 11 and 12 of the biasing bridge 10 to 13, and the connection point between the collector of the output transistor of the second stage 2 and the resistor 4, are taken to ground Gnd by the capacitors 9 and 6 respectively.

The gain of a plurality of stages connected in cascade is equal to the product of the gains. In addition, in a transistor amplifier such as that in FIG. 1, the gain of each stage is proportional to the current that flows through it. Now, in this amplifier, the currents which flow through the two stages are equal. As a result, the total gain of the amplifier is proportional to the square of the current flowing through the amplifier itself. More generally, the gain of the amplifier is proportional to the nth power of the current flowing through the amplifier, where the latter has n stages.

Figure 2:
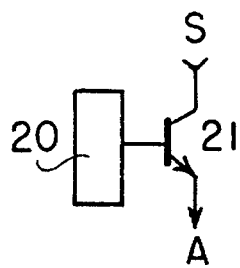
FIG. 2 is a circuit diagram showing a first modified version of gain control means for the circuit of the invention, in which the gain is varied by diverting part of the current.

Reference is now made to FIG. 2, which shows (in relation to FIG. 1) a diagram of a first embodiment of a gain control means of the circuit. In this modified version, a control means is provided for varying the gain of the amplifier by variable amounts of current. This is done by taking current on the output S of the circuit of FIG. 1 by means of a current take-off transistor 21, the collector of which is connected to the output terminal S. The emitter of this transistor 21 is connected to a gain control terminal A of the first stage 2, or current injection terminal, in the circuit of FIG. 1.

The base of the transistor 21 is controlled by a gain adjusting circuit 20 which follows a predetermined law. As a result, if the gain adjusting circuit 20 takes more current by reducing the impedance of the transistor 21, the gain of the whole circuit, which depends on the current flowing through the collectors of the transistors of the two stages 1 and 2, is reduced, as is the product of the currents flowing through each stage. In this way, an effective and sensitive means is available for controlling the gain of the amplifier as a function of any adjusting parameter detected with the aid of the gain adjusting circuit 20. The output of the circuit 20 controls the impedance of the transistor 21 disposed between the terminals S and A of the amplifier.

Figure 3:
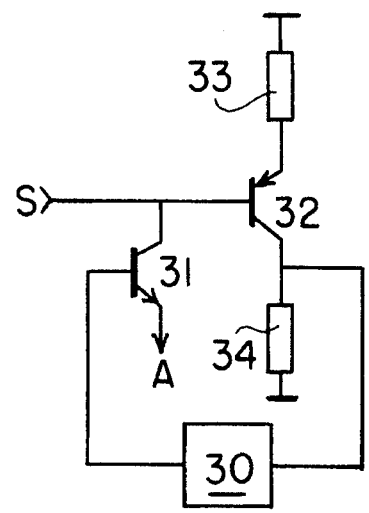
FIG. 3 is a block diagram showing a second modified version of a gain control means for the circuit of the invention.

Reference is now made to FIG. 3, which shows in relation to FIG. 1 a diagram of a second modified version of a control means for the circuit. As in the case of the first modification described above, a transistor 31 is connected, through its collector-emitter path, between the output terminal S of the amplifier shown in FIG. 1 and the terminal A at which current is injected on the emitter of the transistor of the first stage.

The base of the transistor 31 is controlled by a peak value detector circuit 30, which consists in particular of a diode rectifier. The input of this rectifier is connected to the collector of a transistor 32, of PNP polarity opposed to the NPN polarity of the transistor 31. The PNP transistor 32 is connected through its emitter to the positive supply voltage Vcc for the circuit, through a resistor 33, and is connected through its collector to ground Gnd through a resistor 34.

The base of the PNP transistor 32 is connected directly to the output terminal S of the amplifier. Now, because of the biasing, the voltage at the point S remains constant because it is fixed by the voltage of the transistor 31. As a result, the detector circuit 30 enables the gain of the amplifier to be controlled automatically by limiting it before saturation, as a function of the biasing of the transistor 32. As a result, the amplifier is able to work with a high gain while remaining in the linear part of its operating characteristic curve, without any need for excessive current consumption.

Figure 4:
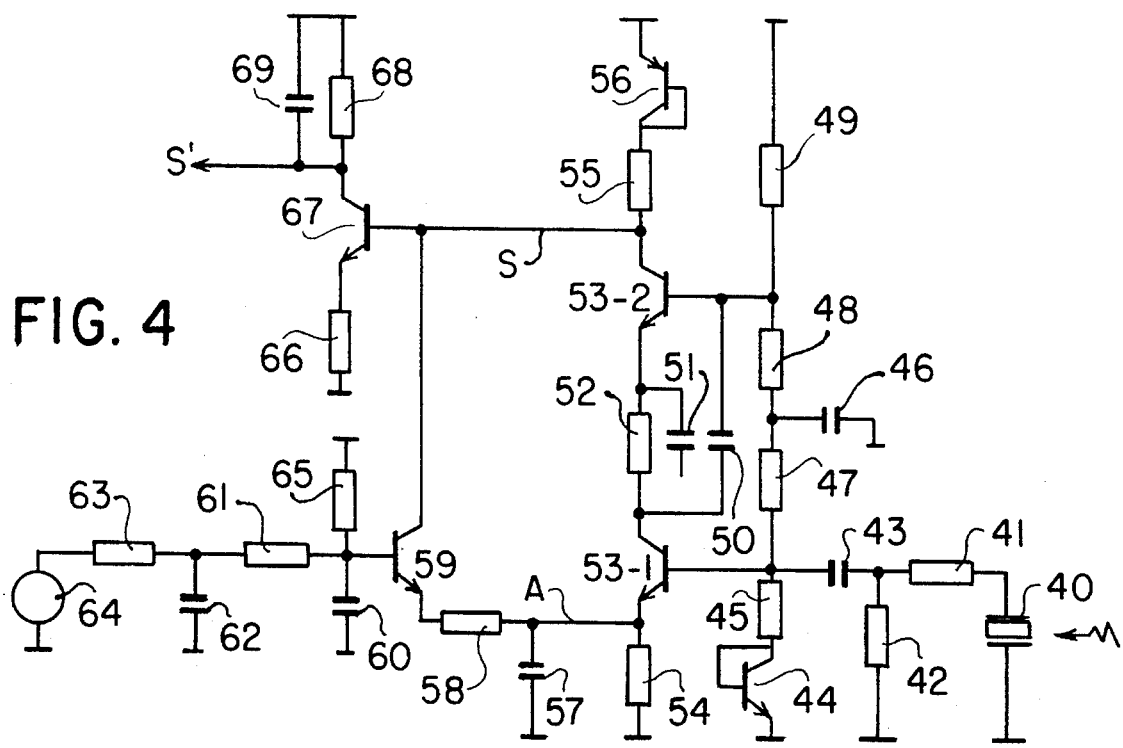
FIG. 4 is a block diagram of an onboard receiver in accordance with the invention, in its application to an ultrasonic alarm system.

Reference is now made to FIG. 4, which is a circuit diagram for one embodiment of an onboard receiver for the reception of interrogation signals. More particularly, the receiver is intended for use in a volumetric ultrasonic alarm system in a vehicle, in which the receiver enables the ultrasonic waves received from a suitable piezoelectric sensor to be detected and amplified.

In FIG. 4, the sensor 40, which detects ultrasonic waves received from within the cabin of the vehicle which is under surveillance by the alarm system which uses this receiver, is connected through a resistor 41 to a high pass filter 42, 43.

In this example, this high pass filter consists of a resistor 42 which is connected to ground, and a capacitor 43 which is connected to the input of the first stage of the amplifier. This first stage comprises, mainly, the biasing bridge 45, 47 to 49 together with two transistor stages 53-1 and 53-2.

Two transistors 56 and 44 are provided. The transistor 56 is connected between the output of the amplifier and the positive supply voltage Vcc, while the transistor 44 is connected between the foot of the biasing bridge and ground. Both of these transistors are connected as diodes in order to provide compensation for thermal effects in the amplifier.

The amplifier with its capacitor 50, which provide coupling between the stages, and capacitors 51 and 46 which provide coupling to ground in the dynamic mode, will not be described any further, because they exactly reproduce the arrangement shown in FIG. 1.

The output S of the second stage 53-2 is connected to a gain control means in the two embodiments seen in FIGS. 2 and 3, which are combined in this example. In this connection, the transistor 67 is of the NPN type and is connected through its base to the output S.

It is connected to ground through its emitter through the emitter resistor 66, and to the positive supply terminal Vcc through a series circuit consisting of a resistor 68 and a capacitor 69.

The output of the onboard receiver is taken at S' on the collector of the transistor 67. This output terminal S' is connected to the input of an analysing circuit (not shown), which can be arranged to produce the alarm function itself.

The transistor 67 fixes the output voltage at the output S, which enables the gain of the circuitry as a whole to be centred about a nominal value. It is thus possible to obtain automatic adjustment of the gain as a function of other parameters, about a central value, such that the operation of the receiver is optimised. This is so in particular in a recurring mode of operation, in which the gain of the receiver is at a maximum at the frequency of recurrence of the interrogation signal, decreasing rapidly for frequencies lying on either side of this value.

Since the gain of the circuit is equal to the product of the gains of its stages, these latter being themselves proportional to the current flowing through their collectors, then if the control current dynamic is 10, the amplifier produces a gain dynamic of 100. As a result, the maximum admissible current can be limited to ten times the minimum current, the latter being fixed, in particular, by the limiting operating characteristics of the transistors.

On the other hand, dynamic control of gain is provided by the transistor 59, the collector-emitter path of which is connected between the output terminal S of the amplifier and the injection terminal A, to which current is diverted, in the manner already described above, on the emitter of the first stage transistor 53-1. However, in this embodiment, both of the transistors are connected through a low pass filter, consisting of a resistor 58 connected in series between the emitter of the transistor 59 and the emitter of the transistor 53-1, and a capacitor 57 which is connected between the emitter of the transistor 53-1 and ground. Control of the transistor 59 is carried out via its base, which is connected through a low pass filter. In this example this low pass filter consists of two first order circuit components 63, 62 and 61, 60. The transistor 59 is biased through the resistor 65 and its low pass input filter.

The low pass filter 60–63 is connected to an output gate 64 of a microcontroller (not shown) which produces recurring square signals, the cyclic ratio of which represents the nominal setting of the gain of the amplifier. In this connection, such a control circuit biased the transistor 59 to a greater or lesser extent, and accordingly controls its impedance in such a way as to cause it to divert a larger or smaller amount of current in the collectors of the two stages of the amplifier, in the manner already described above.

In one practical application of the invention, where it is applied to an ultrasonic alarm system, the output gate 64 of the microcontroller has a resolution of 8 bits, and produces a resolution better than 2 dB with an accuracy of ±5% on the adjustment of the cyclic ratio.

It will be noticed that in this circuitry, current consumption can be as low as 300 microamperes with a bandwidth centred on 40 kilohertz, and a range of linear gain adjustment of 50 dB, when working under a voltage Vcc of 5 volts. A single output gate of the microcontroller is occupied, which enables the receivers to be easily replicated so that a plurality of zones can be under permanent surveillance.

Figure 5:
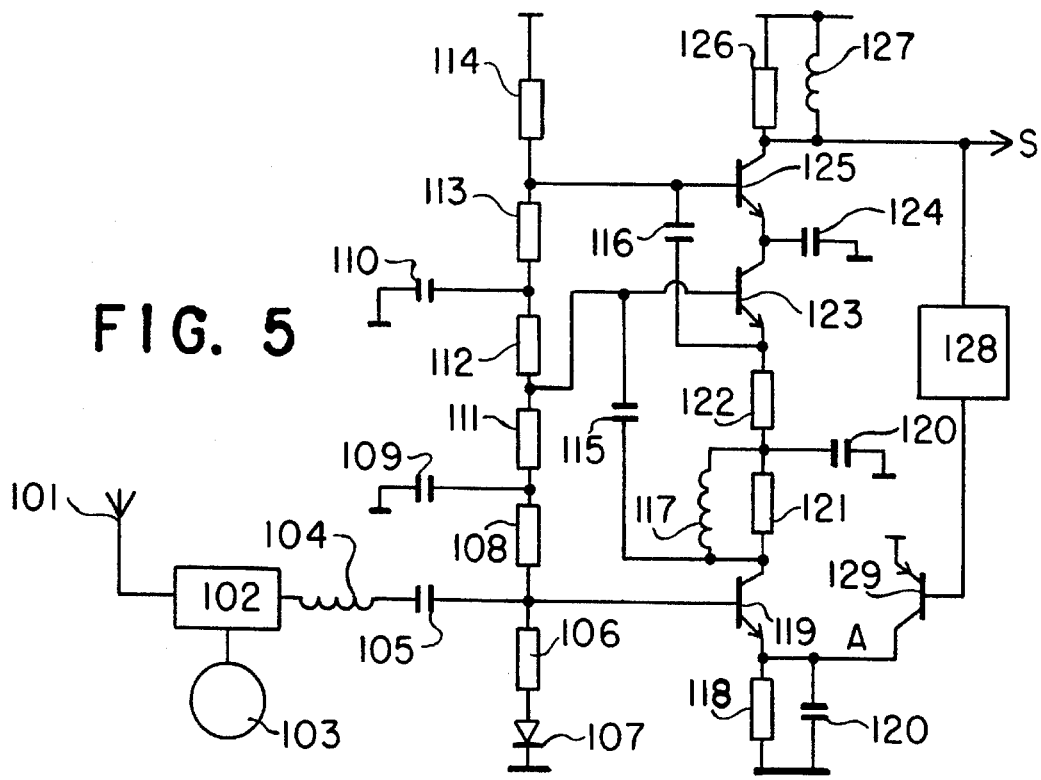
FIG. 5 is a block diagram of an intermediate frequency amplifier in accordance with the invention, in its application to a radio frequency receiver for a keyless vehicle access system.

Reference is now made to FIG. 5, which shows a diagram of an onboard receiver applied to a radio frequency receiver for a keyless access system. In the embodiment of FIG. 5, the amplifier of the invention comprises three stages.

The antenna 101 of the keyless system, for giving access to the vehicle in which the receiver described above is fitted, is connected either directly or through a decoupling capacitor, and optionally through a connecting cable which is matched to the first input of a mixer 102. The second input of the mixer 102 is connected to the input of a local oscillator 103, which produces a wave having a characteristic frequency which is centred on the carrier wave element of the modulated wave received by the antenna 101. The output of the mixer 102 thus produces an intermediate frequency input signal, consisting of the modulating element of the modulated wave and the wave produced by the local oscillator 103. This intermediate frequency input signal is transmitted to the base of a transistor 119, which is the first stage of the amplifier connected in accordance with the present invention, via an inductance 104 which serves to compensate for the input capacitance $C_{BE}$ of the first stage of the intermediate frequency amplifier.

The amplifier of the receiver in FIG. 5 is, in this example, an intermediate frequency amplifier. It comprises three amplifying stages, 119, 123 and 125 respectively. These stages are connected in series having regard to the biasing obtained from the biasing bridge 106–108, 111–114. In the dynamic mode, these three stages are connected in cascade, by means of connections through the reactance 115, which is arranged between the output of the first stage 119 and the input of the second stage 123, and the reactance 116 which is connected between the output of the second stage 123 and the input of the third stage 125. The three stages are separated dynamically in the manner described above, by capacitors 124 and 130 between the three stages, and by capacitors 109 and 110 between the three portions concerned of the biasing bridge.

The emitter of the transistor 119 of the first stage is connected to ground through a resistor 118 in parallel with an emitter decoupling capacitor 120. The collector of the transistor of the first stage 119 is charged through a circuit which consists of a resistor 121 together with an inductance 117, which serves to increase gain at high frequencies and the collector/emitter voltage.

The second stage 123 is arranged as a common collector stage, and its purpose is to enable the impedance between the first stage 119 and the third stage 125 to be matched.

The collector of the transistor 125 of the third stage is connected to the positive supply voltage through a circuit which comprises a resistor 126 and an inductance 127, which serves to increase gain at high frequencies and also the output excursion dynamic.

Either or both of the two high frequency gain enhancing circuits may be replaced by circuits tuned to the intermediate frequency in order to increase the output of the amplifier.

The output S of the amplifier is connected through a gain control circuit 128 to the base of a transistor 129 for injection or current take-off, so as to control the gain of the amplifier in the manner described earlier herein.

In the case of a receiver for a radio frequency telecontrol signal in angular modulation, the control circuit 128 consists of a diode type detector.

What is claimed is:

1. An amplifier suitable as an onboard receiver amplifier for a motor vehicle, comprising a first amplifier stage and a second amplifier stage, a first transistor in said first stage and a second transistor in said second stage, and each said amplifier stage having a biasing network, the biasing networks of the stages being connected in series with each other in such a way as to reduce the power consumption of the amplifier in the static state, each said stage having an input, the amplifier including coupling reactances coupling, respectively, said first transistor to the input and said second transistor input to the first transistor collector, the amplifier further including gain control means for regulating the gain and having an output terminal and a current injection and extraction terminal connected to the emitter of the transistor of the first stage, said gain control means having a current take-off transistor connected between said output terminal and said current injection and extraction terminal, the amplifier including a gain control circuit having an output connected to the base of the current take-off transistor.

2. An amplifier according to claim 1, defining a first connection point between the stages on the collector side of the first transistor and the emitter side of the second transistor, and a second connection point on the base side of said second transistor, and further including a first capacitor connecting the first connection point to ground and a second capacitor connecting the second connection point to ground, whereby to separate the first stage and second stage from each other in the dynamic state.

3. An amplifier according to claim 1, wherein said coupling reactances are such as to work in the bandwidth of the amplifier as impedance converters, whereby to match the output resistance of one stage to the input impedance of the next stage.

4. An amplifier according to claim 1, wherein at least one of said stages has an output branch comprising a circuit for augmentation of the gain at high frequencies.

5. An amplifier according to claim 4, wherein said gain augmentation circuit is matched to the working frequency of the amplifier.

6. An amplifier according to claim 1, further comprising at least a third amplifying stage, said third amplifying stage being connected for impedance matching and disposed between and in series with said first and second amplifier stages of the amplifier.

7. An amplifier according to claim 1, wherein the gain control circuit comprises a transistor having its base connected to the output of the amplifier, and having a conduction path, the amplifier further having a detector circuit having an output connected to the base of the current take-off transistor, the input of the detector circuit being connected to said conduction path.

8. A receiver for an interrogation wave system having an amplifier comprising a first amplifier stage and a second amplifier stage, a first transistor in said first stage and a second transistor in said second stage, and each said amplifier stage having a biasing network, the biasing networks of the stages being connected in series with each other in such a way as to reduce the power consumption of the amplifier in the static state, each said stage having an input, the amplifier including coupling reactances coupling, respectively, said first transistor to the input and said second transistor input to the first transistor collector, the amplifier further including gain control means for regulating the gain and having an output terminal and a current injection and extraction terminal connected to the emitter of the transistor of the first stage, said gain control means having a current take-off transistor connected between said output terminal and said current injection and extraction terminal, the amplifier including a gain control circuit having an output connected to the base of the current take-off transistor; an interrogation signal detector; a low pass filter connecting the input of the amplifier to said interrogation signal detector; and a microcontroller for producing a series of recurring square wave signals having a cyclic ratio which is an adjustment value for the gain of the amplifier, wherein said controller and the gain control means of the amplifier provide an output gate.

9. A receiver for a keyless system for giving access to a vehicle, having an amplifier comprising a first amplifier stage and a second amplifier stage, a first transistor in said first stage and a second transistor in said second stage, and each said amplifier stage having a biasing network, the biasing networks of the stages being connected in series with each other in such a way as to reduce the power consumption of the amplifier in the static state, each said stage having an input, the amplifier including coupling reactances coupling, respectively, said first transistor to the input and said second transistor input to the first transistor collector, the amplifier further including gain control means for regulating the gain and having an output terminal and a current injection and extraction terminal connected to the emitter of the transistor of the first stage, said gain control means having a current take-off transistor connected between said output terminal and said current injection and extraction terminal, the amplifier including a gain control circuit having an output connected to the base of the current take-off transistor; including a mixer having a first input and a second input, a radio frequency receiving antenna connected to said first input, and a local oscillator connected to said second input, the input of the amplifier being connected to the output of the mixer, and the gain control means of the circuit having a diode detector.

* * * * *